(12) United States Patent
Syrjänen et al.

(10) Patent No.: US 12,075,605 B2
(45) Date of Patent: Aug. 27, 2024

(54) ELECTRONIC COMPONENT WITH INTERNAL SHIELDING

(71) Applicant: MURATA MANUFACTURING CO., LTD., Nagaokakyo (JP)

(72) Inventors: Teppo Syrjänen, Helsinki (FI); Ville-Pekka Rytkönen, Klaukkala (FI); Reijo Rautakoski, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 3 days.

(21) Appl. No.: 17/572,073

(22) Filed: Jan. 10, 2022

(65) Prior Publication Data

US 2022/0248576 A1 Aug. 4, 2022

(30) Foreign Application Priority Data

Feb. 4, 2021 (FI) .................................... 20215121

(51) Int. Cl.
*H05K 9/00* (2006.01)
(52) U.S. Cl.
CPC .................................. *H05K 9/0049* (2013.01)
(58) Field of Classification Search
None
See application file for complete search history.

(56) References Cited

U.S. PATENT DOCUMENTS

| 8,008,753 B1 | 8/2011 | Bolognia |
| 2001/0033478 A1 | 10/2001 | Ortiz et al. |
| 2005/0061528 A1* | 3/2005 | Bayar ............... H05K 9/0056 174/51 |
| 2006/0274517 A1* | 12/2006 | Coffy ............... H01L 23/552 174/262 |
| 2009/0265931 A1* | 10/2009 | Cheng ............... H05K 9/003 29/887 |
| 2009/0266601 A1* | 10/2009 | Cheng ............... H05K 9/003 174/377 |
| 2009/0302439 A1* | 12/2009 | Pagaila ............... H01L 23/3121 257/E23.18 |

(Continued)

FOREIGN PATENT DOCUMENTS

| JP | 2010-177520 A | 8/2010 |
| JP | 2010-225620 A | 10/2010 |

(Continued)

OTHER PUBLICATIONS

European Search Report dated Jun. 9, 2022, corresponding to European Patent Application No. 21216971.

(Continued)

*Primary Examiner* — James Wu
*Assistant Examiner* — Christopher L Augustin
(74) *Attorney, Agent, or Firm* — SQUIRE PATTON BOGGS (US) LLP

(57) ABSTRACT

An electronic component is provided that includes a package base and a metallic cap. The metallic cap separates the enclosure into at least a first compartment and a second compartment. An electronic chip is in the first compartment, and the metallic cap separates the enclosure into the first and second compartments with its shape which forms a separator which extends from the ceiling of the first compartment toward the mounting plane of the electronic chip.

7 Claims, 3 Drawing Sheets

(56) References Cited

U.S. PATENT DOCUMENTS

| | | | |
|---|---|---|---|
| 2011/0186943 A1 | 8/2011 | Pahl et al. | |
| 2012/0025356 A1* | 2/2012 | Liao | H01L 25/0655 257/659 |
| 2013/0170172 A1* | 7/2013 | Reitlinger | H05K 3/22 29/829 |
| 2013/0271928 A1* | 10/2013 | Shimamura | H05K 13/00 29/841 |
| 2015/0173258 A1* | 6/2015 | Chen | H05K 9/0039 361/753 |
| 2015/0201532 A1* | 7/2015 | Soyano | H01L 23/552 361/752 |
| 2016/0095267 A1* | 3/2016 | Kitazaki | H05K 1/0216 361/760 |
| 2017/0090532 A1* | 3/2017 | Koukami | G06F 1/203 |
| 2018/0049311 A1* | 2/2018 | Hoang | H01L 25/105 |
| 2018/0110164 A1* | 4/2018 | Furutani | H05K 9/0086 |
| 2020/0098655 A1 | 3/2020 | Nair et al. | |
| 2020/0126896 A1 | 4/2020 | Yoshioka et al. | |
| 2020/0203287 A1 | 6/2020 | Krefft et al. | |
| 2020/0337187 A1* | 10/2020 | Otsubo | H05K 3/284 |
| 2020/0359534 A1* | 11/2020 | Perry | H05K 9/0032 |
| 2021/0015008 A1* | 1/2021 | Ohkubo | H05K 5/0047 |
| 2023/0156932 A1* | 5/2023 | Tsuzuki | H01L 25/18 361/807 |

FOREIGN PATENT DOCUMENTS

| | | |
|---|---|---|
| JP | 2017-212377 A | 11/2017 |
| JP | 2019-106404 A | 6/2019 |
| WO | 2012/101920 A1 | 8/2012 |

OTHER PUBLICATIONS

Finnish Search Report dated Sep. 27, 2021 corresponding to Finnish Patent Application No. 20215121.

Notification of Reasons for Refusal issued in corresponding Japanese Patent Application No. 2022-010929, dated Dec. 20, 2022.

Extended European Search Report dated Sep. 1, 2023, corresponding to European Patent Application No. 23164566.4.

Apple Inc: "Considerations on NR enhancements for XR", 3GPP Draft; RWS-210500, 3rd Generation Partnership Project (3GPP), Mobile Competence Centre ; 650, Route Des Lucioles ; F-06921 Sophia-Antipolis Cedex ; FRANCE vol. TSG RAN, No. Electronic Meeting; Jun. 28, 2021-Jul. 2, 2021 Jun. 7, 2021 (Jun. 7, 2021).

* cited by examiner

ELECTRONIC COMPONENT WITH INTERNAL SHIELDING

FIELD OF THE DISCLOSURE

The present disclosure relates to shielding of an electronic chip from electromagnetic radiation, and more particularly to shielding the chip from internal radiation generated in other parts of the same component. The present disclosure further concerns the use of a metallic cap as a shield.

BACKGROUND OF THE DISCLOSURE

Electronic components typically comprise at least one electronic chip and a package. The chip is attached to a mounting surface inside the package and may be electrically connected to external devices with electric wires which extend from the chip to external connectors. The package provides protection for the electronic chip and it may also shield the chip from external electromagnetic radiation.

However, the electronic chip may also be sensitive to electromagnetic radiation emitted by other parts of the electronic component within the same package. These parts may include an adjacent chip or the electric wiring by which chips are connected to external devices.

Document US2012025356 discloses an electronic component where an internal barrier is formed inside an electronic component to separate the component into neighbouring compartments which are shielded from each other.

BRIEF DESCRIPTION OF THE DISCLOSURE

This disclosure describes an arrangement which is characterized by what is stated in the independent claim. The preferred embodiments of the disclosure are disclosed in the dependent claims. The disclosure is based on the idea of forming a metallic cap into a shape which divides the underlying enclosure into shielded compartments when the cap is placed over a chip to form an enclosed electronic component.

An advantage of this arrangement is that internal shielding can be accomplished in a simple manner.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
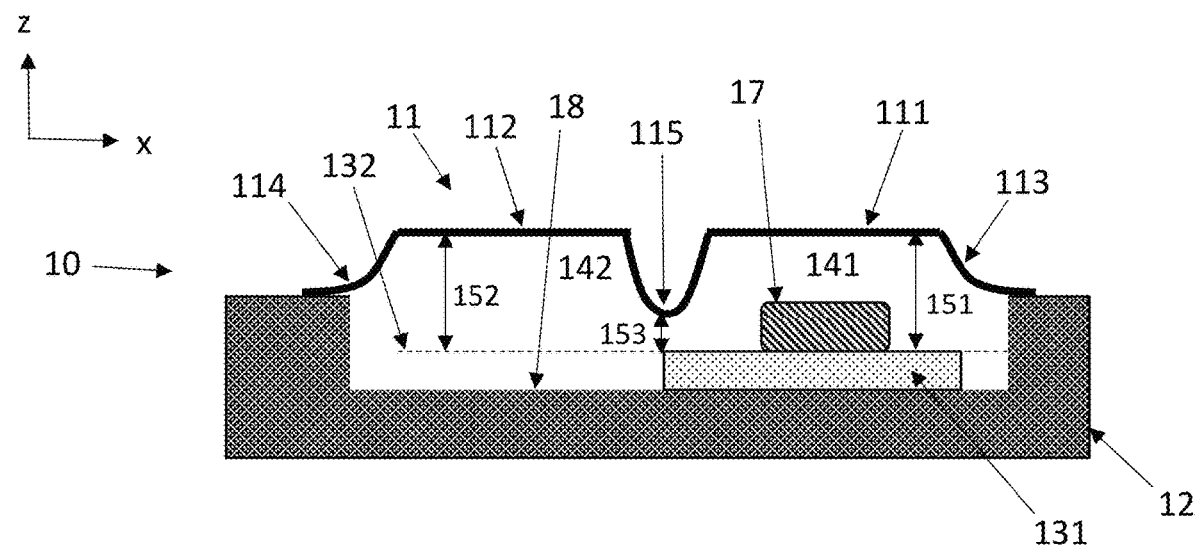
FIG. 1 illustrates an electronic component with a cap which forms a separator.

This disclosure describes an electronic component comprising a package base and a metallic cap. The cap is attached to the package base to form an enclosure. The electronic component comprises at least one electronic chip which is mounted on a chip-mounting surface in the package base within said enclosure. The chip-mounting surface defines a first plane.

The metallic cap separates the enclosure into at least a first compartment and a second compartment. The electronic chip is in the first compartment, and the metallic cap separates the enclosure into the first and second compartments with its shape which forms:
- at least one first sidewall and a first compartment ceiling joined to the at least one first sidewall,
- at least one second sidewall and a second compartment ceiling joined to the at least one second sidewall,
- at least one separator which extends between the first compartment ceiling and the second compartment ceiling, wherein the separator extends from the first compartment ceiling toward the first plane.

In this disclosure, the term "electronic chip" refers to a unencapsulated electronic device, while "electronic component" refers to an encapsulated device which has been protected from the surrounding environment. The electronic chip may be mounted onto a circuit board inside the electronic component. The circuit board forms the chip-mounting surface and may contain the control circuits required by the chip. Wires may be drawn from the circuit board or from the chip itself to the outside of the electronic component to facilitate electrical access. The electronic component may itself be mounted onto a larger circuit board. The electronic chip may for example be a microelectromechanical (MEMS) chip.

In the figures of this disclosure, the chip mounting surface defines an xy-plane and the z-axis is perpendicular to this xy-plane. The heights mentioned in this disclosure are measured in the direction of the z-axis. Expressions such as "down", "up", "above" and "below" correspond to the direction of z-axis illustrated in the figures, which points in the "up" direction. These expressions, and the "heights" discussed below, do not imply anything about how the component should be oriented during use or manufacture.

The metallic cap may be a continuous metallic sheet. The sheet may be shaped into the desired shape by pressing and/or bending the sheet. The metallic cap may consist of a metallic material, which may for example be aluminium, copper, an aluminium or copper compound or stainless steel. Alternatively, the metallic cap may comprise a polymer foil which has been coated with one of the metallic materials mentioned above, or a moulded plastic body which has been coated with one of the metallic materials mentioned above. The continuous metallic sheet may in these cases be a continuous polymer foil or moulded plastic body with a metallic coating.

The package base may for example be formed by a polymer which has been moulded around the chip-mounting surface. The chip-mounting surface may in this case be a die pad which has been formed from a leadframe or a separate support surface which has been attached to the die pad. The package base could alternatively be any suitable structure which contains a chip-mounting surface or to which a chip-mounting surface has been attached.

The distance from the first plane to the first compartment ceiling in the direction perpendicular to the first plane may be called the height of the first compartment. The distance from the first plane to the second compartment ceiling in the direction perpendicular to the first plane may be called the height of the second compartment. The distance between the first plane and the separator in the direction of the metallic cap is the height of a separator gap.

FIG. 1 illustrates an electronic component 10. The component comprises a package base 12 and a metallic cap 11. Together they form an encapsulation around the electronic chip 17 which is mounted on a chip-mounting surface 131. The chip-mounting surface defines a first plane 132. The first plane 132, and any plane parallel to it, may be called a horizontal plane. Directions perpendicular to the first plane may be called vertical. The vertical axis is illustrated as the z-axis in FIG. 1, and it points in a direction which may be called "up" in this disclosure. The opposite direction may be called "down". Words such as "top" and "bottom" may be used with the same meaning. However, these designations are made merely to facilitate convenient references to different directions—they do not imply anything with regard to how the component should be oriented during use or manufacturing.

The cap 11 and the package base 12 delimit an enclosure, which may also be called a cavity, where the chip 17 and the chip-mounting surface 131 are located. The chip-mounting surface may be the floor of this enclosure, so that the first plane and the bottom of the enclosure have the same z-coordinate. Alternatively, as FIG. 1 illustrates, the chip-mounting surface 131 may be elevated in relation to the bottom of the enclosure 18, so that the first plane 132 and the floor 18 of the enclosure do not have the same z-coordinate.

In all embodiments presented in this disclosure, the enclosure may be filled with a gas. This gas will typically be air, but other gases could also be used. Alternatively, the enclosure may be partly or fully filled with an inert and viscous fluid, for example a gel, before the metallic cap is placed on top of it.

In all embodiments presented in this disclosure, the metallic cap may be a self-supporting cap. In other words, the metallic cap may be so stiff that when one part of the cap is fixed to a fixing point on the package base, the rest of the cap will also remain fixed in relation to that fixing point. In FIG. 1 for example, only the edges (left and right in the figure) of the metallic cap 11 are attached to the package base. The cap supports its own weight, so the central parts of the metallic cap will not be bent or deformed by gravity.

The metallic cap 11 separates the enclosure into at least a first compartment 141 and a second compartment 142. The metallic cap 11 comprises a first sidewall 113 and a second sidewall 114. The metallic cap also comprises a first compartment ceiling 111 and a second compartment ceiling 112. The vertical distance 151 from the first plane 132 to the first compartment ceiling 111 is the height of the first compartment 141. The vertical distance 152 from the first plane 132 to the second compartment ceiling 112 is the height of the second compartment 142.

The metallic cap also comprises a separator 115 which has been formed between the first compartment ceiling 111 and the second compartment ceiling 112. The separator extends downward toward the first plane 132. The vertical distance 153 between the lowermost part of the separator 115 and the first plane 132 is the height of the separator gap. In FIG. 1, the separator also extends downward from both the first compartment ceiling 111 and from the second compartment ceiling 112. However, as will be explained in more detail below, the latter feature (extension downward from the second compartment ceiling) is optional, and the separator may extend downward only from the first compartment ceiling.

The first compartment ceiling 111 and second compartment ceiling 112 have been illustrated as horizontals ceilings in FIG. 1, but they do not necessarily have to be horizontal. Either one or both could be vertically sloping ceilings. The vertical distance 153 is in either case calculated at the border between the first compartment ceiling 111 and the separator 115.

The separator 115 constitutes an internal shield within the electrical component 11. It may shield the electronic chip 17 from electromagnetic radiation generated in the second compartment 142. The device parts which generate electromagnetic radiation in the second compartment 142 may for example include another component or electric wiring (neither of which is illustrated in FIG. 1).

The separator gap is measured from the first plane to the lower edge of the separator. The height of the separator gap may for example be in one of the following ranges, where percentages indicate the ratio between the height of the separator gap and the height of the first compartment: 0%-90%, 0%-70%, 0%-50%, 0%-30%, 0%-10%, 1%-90%, 1%-70%, 1%-50%, 1%-30%, 1%-10% 10%-90%, 30%-90%, 50%-90%, or 70%-90%. The ratio is 0% if the height of the separator gap is zero. A separator gap equal to zero means that the separator 115 reaches all the way down to the first plane 132.

In some cases, this could mean that the separator comes into direct contact with the chip-mounting surface. On the other hand, the chip-mounting surface may in some cases not pass under the separator 115. The separator 115 may then extend below the first plane 132. In this disclosure, the distance between the first plane and the separator is defined in the direction of the metallic cap—that is, it is the vertical distance from the first plane to the separator in the direction which points upward from the first plane 132 in FIG. 1. This means that if the separator 115 extends below the first plane 132, the height of the separator gap is negative.

Figure 2A:
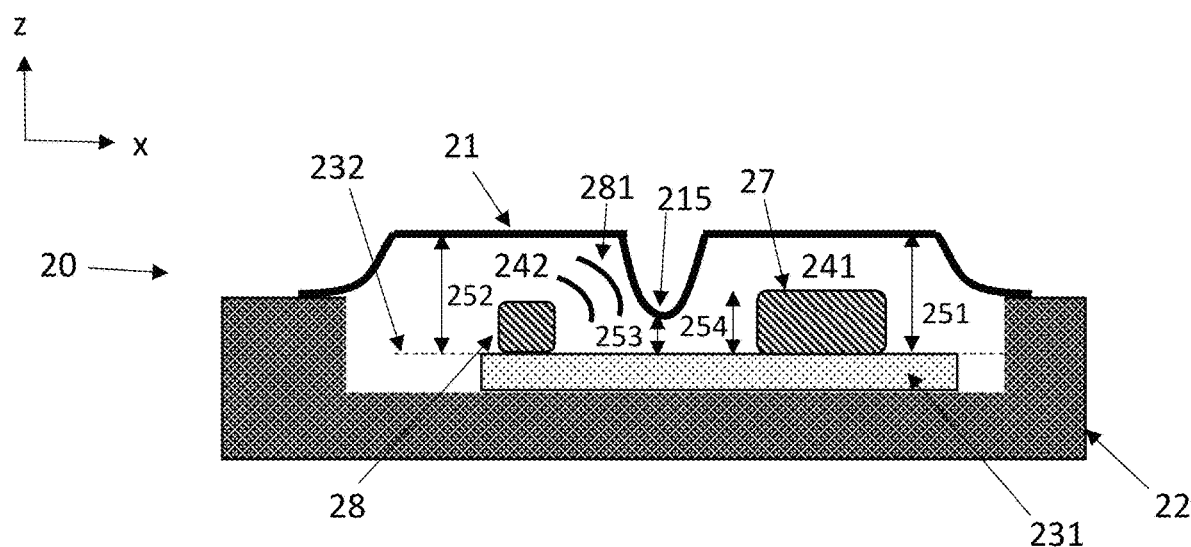
FIG. 2a illustrates an electronic component with a chip-mounting surface which extends from the first compartment to the second compartment.
Figure 2B:
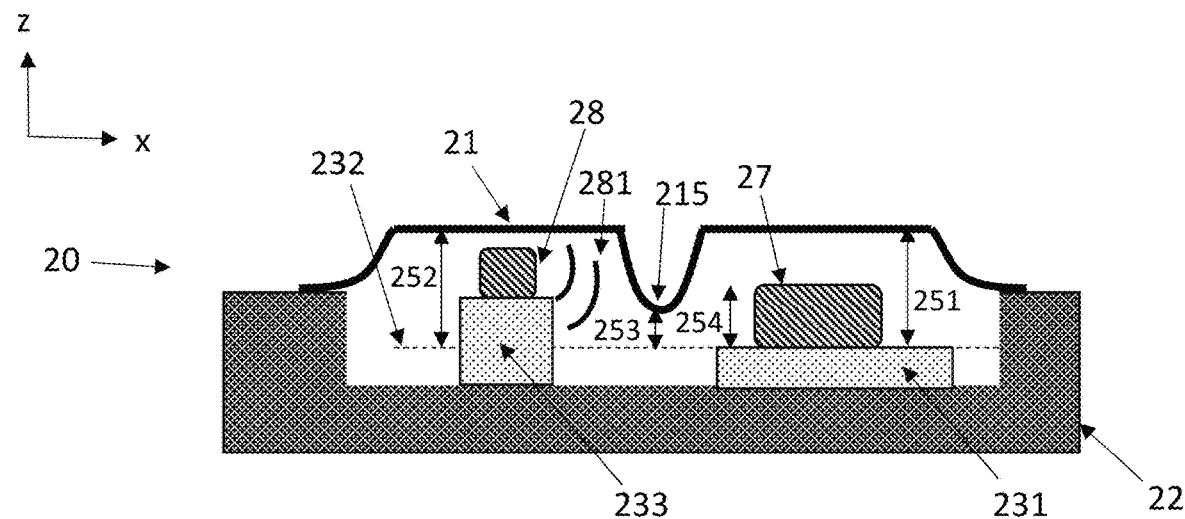
FIG. 2b illustrates an electronic component with a chip-mounting surface which is restricted to the first compartment.

The first and second sidewalls 113 and 114 may be attached to the package base 12, or to any structure on the top surface of the package base, to form the enclosure. The metallic cap 11 may comprise additional sidewalls (not illustrated) which allow the cap 11 to be attached to the package base 12 around the perimeter of the package base so that the enclosure is delimited by the package base 12 and the metallic cap 11 on all sides. FIGS. 2a and 2b illustrate an electronic component where reference numbers 20, 21, 215, 22, 231-232, 241-242, 251-253 and 27 correspond to reference numbers 10, 11, 115, 12, 131-132, 141-142, 151-153 and 17, respectively, in FIG. 1. The chip-mounting surface 231 here extends from the first compartment 241 to the second compartment 242. An emitting device part 28 which lies on the chip-mounting surface 231 in the second compartment 242 emits electromagnetic radiation 281 which could disturb the electronic chip 27.

It may in some cases be necessary to maximize the protection of the electronic chip 27 from radiation 281 by making the height of the separator gap 253 zero. However, a zero-height gap is not always necessary. Adequate protection may often be obtained even with a separator gap which is greater than zero because the sensitivity of electronic chip 27 to the radiation 281 may be affected by many different variables, such as the height of the component 254, the placement of the emitting device part 28 in the second compartment 242, and the height of the surfaces where part 28 and chip 27 are mounted. FIG. 2b illustrates an electronic component where the emitting device part has been mounted on a surface which is clearly higher than the first plane 232, which will reduce the exposure of the chip 27 to the radiation 281.

The height of the separator gap may be greater than zero, and the height of the second compartment may be greater than the height of the separator gap. This option has already ben illustrated in FIGS. 1 and 2a-2b above.

Figure 3:
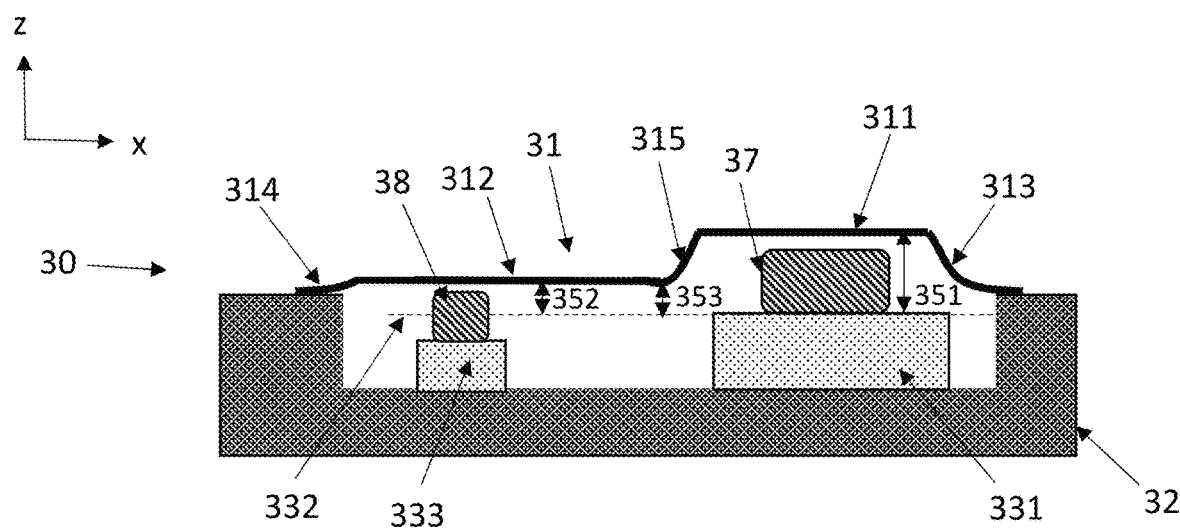
FIG. 3 illustrates an electronic component where the height of the second compartment is equal to the height of the separator gap.

The height of the separator gap may be greater than zero, and the height of the second compartment may be substantially equal to the height of the separator gap. FIG. 3 illustrates an electronic component where reference numbers 30, 31, 311-315, 331-333, 351-353, 37 and 38 correspond to reference numbers 10, 11, 111-115, 131-133, 151-153 and 17, respectively, in FIG. 1. The height of the second compartment 352 is in this case substantially equal to the height of the separator gap 353. Due to the shape of the cap 31 and the presence of the separator 315, the impact of internal electromagnetic radiation on the electronic chip will be here also be reduced compared to a situation where the first and second compartment would be equally high and no separator would be present.

The chip-mounting surface may extend from the first compartment to the second compartment, and the chip-mounting surface may be a circuit board. Furthermore, wires which provide a communication interface connection to the electronic chip may be attached to the circuit board in the second compartment. The communication interface can transmit data to and from the circuit board. It may for example be a serial-peripheral interface (SPI), an inter-integrated circuit ($I^2C$) interface or a peripheral sensor interface (PSI5).

Figure 4:
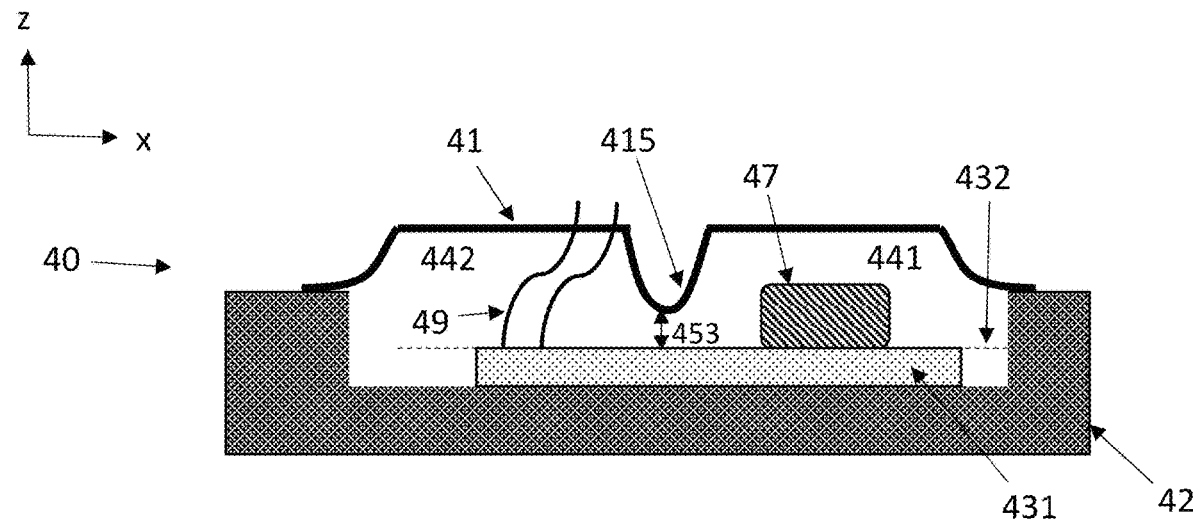
FIG. 4 illustrates an electronic component where the chip-mounting surface is a circuit board to which wiring is attached.
Figure 5:
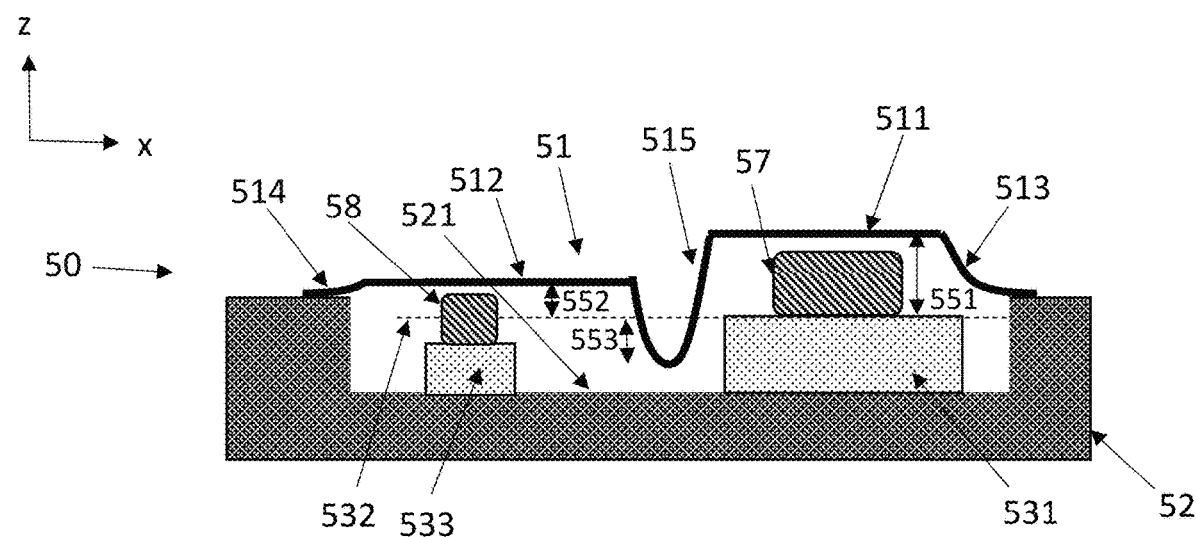
FIG. 5 illustrates an electronic component where the separator extends below the first plane.

FIG. 4 illustrates an electronic component where reference numbers 40, 41, 415, 42, 431-432, 453 and 47 correspond to reference numbers 10, 11, 115, 12, 131-132, 153 and 17, respectively, in FIG. 1. The chip-mounting surface 431 is in this case a circuit board to which wiring 49 is attached. This wiring 49 may extend outside of the enclosure as FIG. 4 illustrates (not necessarily in the vertical direction). The wiring 49 has been built on the circuit board so that it is located in the second compartment 442 when the metallic cap 41 is placed over the package base 42. The cap will then provide internal shielding for the electronic chip 47 from electromagnetic radiation emitted by the wiring 49. As mentioned above, the wiring may for example include a communication interface to the circuit board which the chip has been mounted on, or any other wires which may emit so much electromagnetic radiation that disturbances are possible in the electronic chip 47. The separator may extend below the first plane so that the height of the separator gap is negative. FIG. 5 illustrates an electronic component where reference numbers 50, 51, 511-515, 531, 532, 551-553 and 57 correspond to reference numbers 10, 11, 111-115, 131, 132, 151-153 and 17, respectively, in FIG. 1. Reference numbers 58 and 533 correspond to reference numbers 38 and 333, respectively, in FIG. 3a. This arrangement may be convenient in devices where the chip-mounting surface 131 extends high above the floor 521 of the enclosure. The separator 515 may extend to the floor of the enclosure.

A separator—floor gap may be defined as the vertical distance from the floor 521 of the enclosure to the lowest part of the separator 515. The height of this separator—floor gap then for example be in one of the following ranges: 0%-90%, 0%-70%, 0%-50%, 0%-30%, 0%-10%, 1%-90%, 1%-70%, 1%-50%, 1%-30%, 1%-10% 10%-90%, 30%-90%, 50%-90%, or 70%-90%, where the percentages indicate the ratio between the height of the separator-floor gap and the height of the chip-mounting surface 531. The height of the chip-mounting surface 531 is the vertical distance from the floor 521 to the first plane 532.

The invention claimed is:

1. An electronic component comprising a package base and a metallic cap which is attached to the package base to form an enclosure, wherein the electronic component comprises at least one electronic chip which is mounted on a chip-mounting surface in the package base within the enclosure, whereby the chip-mounting surface defines a first plane,
   wherein the metallic cap is a self-supporting cap, and the metallic cap separates the enclosure into at least a first cavity and a second cavity, and the electronic chip is in the first cavity, and the metallic cap separates the enclosure into the first and second cavities with its shape which forms:
   at least one first sidewall and a first cavity ceiling joined to the at least one first sidewall,
   at least one second sidewall and a second cavity ceiling joined to the at least one second sidewall, and
   at least one separator which extends between the first cavity ceiling and the second cavity ceiling, wherein the separator extends from the first cavity ceiling toward the first plane and constitutes an internal shield within the electrical component, wherein a separator gap is formed between a bottom of the separator and the first plane, which connects the first cavity and the second cavity,
   wherein the metallic cap is attached to the package base around a perimeter of the package base so that the enclosure is delimited by the package base and the metallic cap on all sides, and the electronic chip is a microelectromechanical (MEMS) chip.

2. The electronic component according to claim 1, wherein a distance between the first plane and the separator in a direction of the metallic cap is a height of the separator gap, and the height of the separator gap is substantially zero.

3. The electronic component according to claim 1, wherein a distance between the first plane and the separator in a direction of the metallic cap is a height of the separator gap, a distance from the first plane to the second cavity ceiling in a direction perpendicular to the first plane is a height of the second cavity, and the height of the separator gap is greater than zero, and the height of the second cavity is substantially equal to the height of the separator gap.

4. The electronic component according to claim 1, wherein a distance between the first plane and the separator in a direction of the metallic cap is a height of the separator gap, a distance from the first plane to the second cavity ceiling in a direction perpendicular to the first plane is a height of the second cavity, and the height of the separator gap is greater than zero, and the height of the second cavity is greater than the height of the separator gap.

5. The electronic component according to claim 1, wherein the chip-mounting surface extends from the first cavity to the second cavity, and the chip-mounting surface is a circuit board.

6. The electronic component according to claim 5, wherein wires which provide a communication interface connection to the electronic chip are attached to the circuit board in the second cavity.

7. The electronic component according to claim 1, wherein a distance between the first plane and the separator in a direction of the metallic cap is a height of the separator gap, and the separator extends below the first plane so that the height of the separator gap is negative.

* * * * *